(12) United States Patent
Chen (10) Patent No.: US 11,852,935 B2
(45) Date of Patent: Dec. 26, 2023

(54) DISPLAY PANEL AND METHOD OF MANUFACTURING SAME

(71) Applicant: SHENZHEN CHINA STAR OPTOELECTRONICS SEMICONDUCTOR DISPLAY TECHNOLOGY CO., LTD., Shenzhen (CN)

(72) Inventor: Fangfu Chen, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 567 days.

(21) Appl. No.: 16/972,961

(22) PCT Filed: Nov. 26, 2020

(86) PCT No.: PCT/CN2020/131788
§ 371 (c)(1),
(2) Date: Dec. 7, 2020

(87) PCT Pub. No.: WO2022/048047
PCT Pub. Date: Mar. 10, 2022

(65) Prior Publication Data
US 2022/0197095 A1 Jun. 23, 2022

(30) Foreign Application Priority Data
Sep. 2, 2020 (CN) .......................... 202010907676.4

(51) Int. Cl.
*G02F 1/1362* (2006.01)
*H01L 21/66* (2006.01)
*H01L 27/12* (2006.01)

(52) U.S. Cl.
CPC .. *G02F 1/136263* (2021.01); *G02F 1/136295* (2021.01); *H01L 22/22* (2013.01); *H01L 27/1244* (2013.01)

(58) Field of Classification Search
None
See application file for complete search history.

(56) References Cited

U.S. PATENT DOCUMENTS 5,859,679 A * 1/1999 Song ...................... G02F 1/1362
349/55
6,111,621 A * 8/2000 Kim ....................... G02F 1/1309
349/40

(Continued)

FOREIGN PATENT DOCUMENTS

| CN | 102540508 A | 7/2012 |
| CN | 202693964 U | 1/2013 |

(Continued)

OTHER PUBLICATIONS

PCT International Search Report for International Application No. PCT/CN2020/131788, dated May 27, 2021, 7pp.

(Continued)

*Primary Examiner* — Khaja Ahmad
(74) *Attorney, Agent, or Firm* — The Roy Gross Law Firm, LLC; Roy Gross (57) ABSTRACT

A display panel and a method of manufacturing the display panel are provided. Wherein, a display region of the display panel includes a plurality of gate lines extending laterally and a gate repair line, a plurality of gate connection lines extending longitudinally to a non-display region, and a first connection repair line extending longitudinally. The gate repair line is connected to the first connection repair line in a one-to-one correspondence, each of the gate repair line is provided with a plurality of first connection repair points, (Continued)

and each of the first connection repair lines is provided with a plurality of second connection repair points.

20 Claims, 8 Drawing Sheets

(56) References Cited

U.S. PATENT DOCUMENTS

| | | | |
|---|---|---|---|
| 6,327,007 | B1 | 12/2001 | Shim |
| 6,618,101 | B1* | 9/2003 | Kim .................. G02F 1/136204 |
| | | | 349/54 |
| 2008/0158127 | A1* | 7/2008 | Chang .................. G09G 3/3688 |
| | | | 345/93 |
| 2015/0042550 | A1* | 2/2015 | Wang .................... G02F 1/1309 |
| | | | 345/98 |
| 2016/0189644 | A1* | 6/2016 | So ........................ G09G 3/3233 |
| | | | 345/103 |

FOREIGN PATENT DOCUMENTS

| | | |
|---|---|---|
| CN | 104731405 A | 6/2015 |
| CN | 106297646 A | 1/2017 |
| CN | 109683413 A | 4/2019 |

OTHER PUBLICATIONS

PCT Written Opinion of the International Search Authority for International Application No. PCT/CN2020/131788, dated May 27, 2021, 6pp.

Chinese Office Action issued in corresponding Chinese Patent Application No. 202010907676.4 dated Dec. 15, 2022, pp. 1-7, 19pp.

* cited by examiner

DISPLAY PANEL AND METHOD OF MANUFACTURING SAME

CROSS REFERENCE TO RELATED APPLICATIONS

The present application is a National Phase of PCT Patent Application No. PCT/CN2020/131788 having International filing date of Nov. 26, 2020, which claims the benefit of priority of a Chinese patent application filed on Sep. 2, 2020 with the National Intellectual Property Administration, application number 202010907676.4, titled "A display panel and a method of manufacturing the display panel". The contents of the above applications are all incorporated by reference as if fully set forth herein in their entirety.

FIELD OF INVENTION

The present application relates to the field of display technologies, and in particular to a display panel and method of manufacturing the same.

BACKGROUND OF INVENTION

With development and popularization of new technology products with 4K and 8K high-resolution, ultra-narrow borders and/or no borders (such as border less than or equal to 0.9 mm) of liquid crystal display (LCD) panels, traditional panel designs can no longer meet needs of high specifications. In order to meet requirements of narrow borders and/or no borders and high-resolution specifications, gate driver on array (GOA, gate driver on a glass substrate)/gate chip-on-film (GCOF) in the liquid crystal panels are disposed on a source border at a side of display panels in the industry, and the source border is no longer disposed at opposite sides of the display panels. If this technology is adopted, a product manufacturing process generally needs to add a gate insulation layer (GI) metal mask configured to lead gates to sides of sources inside a panel for driving through guiding holes (or vias).

Due to high-resolution LCD panels, connection vias inside the panel are very dense. For example, number of the connection vias for 4K is 2160, and number of the connection vias for 8K is 4320. In order to reduce an influence of an aperture ratio inside the panel, the connection vias in a display region need to be very small, such as less than 3*3 um, etc., which exceeds the limitation of a conventional via process capability. Due to a process fluctuation of manufacturing the connection vias and/or other process fluctuations, gate lines of a first metal layer and gate connection lines of a second metal layer in the display panel are likely to result in poor contact or connection failure. Poor contact or connection failure cannot be detected by a current detection technology, which causes the display panel to appear abnormal when lighting. In this way, it is easy to cause the display panel to be scrapped, and reduces a product yield of the display panel.

SUMMARY OF INVENTION

Technical Problem

Embodiments of the present application provide a display panel and a method of manufacturing the display panel, which can solve problems of poor contact or connection failure between gate lines and gate connection lines in a display panel, and improves a product yield of the display panel.

Technical Solutions

An embodiment of the present application provides a display panel, including:
a display region and a non-display region positioned at a side of the display region,
wherein the display region includes: a plurality of gate lines extending laterally, at least one gate repair line, a plurality of gate connection lines extending longitudinally to the non-display region, and at least one first connection repair line extending longitudinally;
wherein the at least one gate repair line is connected to the at least one first connection repair line in a one-to-one correspondence, each of the at least one gate repair line is provided with a plurality of first connection repair points positioned in one-to-one correspondence with the gate connection lines, and each of the first connection repair lines is provided with a plurality of second connection repair points positioned in one-to-one correspondence with the gate lines.

Wherein, the gate lines and the at least one gate repair line are arranged in a same layer, and the gate connection lines and the at least one first repair line are arranged in a same layer.

Wherein, orthographic projections of the gate connection lines on a level of the at least one gate repair line are intersected with each of the at least one gate repair line, and intersection positions are defined as first connection repair points.

Wherein, orthographic projections of the at least one first connection repair line on a level of the gate lines are intersected with each of the gate lines, and intersection positions are defined as second connection repair points.

Wherein, the at least one gate repair line is disposed at a side of the gate lines close to the non-display region.

Wherein, the at least one first connection repair line is disposed at at least one side of the gate connection lines.

Wherein, the display region further includes at least one second connection repair line extending longitudinally, the at least one first connection repair line and the at least one second connection repair line are arranged at opposite sides of the gate connection lines, respectively,
the at least one gate repair line is connected to the at least one second connection repair line in one-to-one correspondence, and each of the at least one second connection repair line is provided with a plurality of third connection repair points positioned in one-to-one correspondence with the gate lines.

Wherein, orthographic projections of the at least one second connection repair line on a level of the gate lines are intersected with the gate lines, and intersection positions are defined as third connection repair points.

Wherein, the at least one gate repair line and the at least one first connection repair line are connected to each other in a one-to-one correspondence through a plurality of first vias, and the at least one gate repair line and the at least one second connection repair line are connected to each other in a one-to-one correspondence through a plurality of second vias.

An embodiment of the present application further provides a method of manufacturing a display panel, wherein the display panel includes a display region and a non-display region positioned at a side of the display region, and the method of manufacturing the display panel includes:

forming a plurality of gate lines extending laterally, at least one gate repair line, a plurality of gate connection lines extending longitudinally to the non-display region, and at least one first connection repair line extending longitudinally on the display region, wherein the at least one gate repair line is connected to the at least one first connection repair line in a one-to-one correspondence, each of the at least one gate repair line is provided with a plurality of first connection repair points positioned in one-to-one correspondence with the gate connection lines, and each of the first connection repair lines is provided with a plurality of second connection repair points positioned in one-to-one correspondence with the gate lines; and during a lighting test, wherein if a connection failure between a target gate line of the gate lines and a corresponding target gate connection line is detected, a target gate repair line is determined from the at least one gate repair line, one of the first connection repair lines connected to the target gate repair line is determined to be a target first connection repair line, and the first connection repair points on the target gate repair line positioned corresponding to the target gate connection line and the second connection repair points on the first connection repair line positioned corresponding to the target gate line are welded, to make the target gate connection line electrically connected to the target gate line through the target gate repair line and the target first connection repair line.

Wherein, the method of manufacturing the display panel further includes:

forming at least one second connection repair line extending longitudinally on the display region, wherein the at least one first connection repair line and the at least one second connection repair line are arranged at opposite sides of the gate connection lines, respectively, the at least one gate repair line is connected to the at least one second connection repair line in one-to-one correspondence, and each of the at least one second connection repair line is provided with a plurality of third connection repair points positioned in one-to-one correspondence with the gate lines;

wherein after the connection failure between the target gate line of the gate lines and the corresponding target gate connection line is detected, the method further includes determining one of the second connection repair lines connected to the target gate repair line to be a target second connection repair line, and the third connection repair points on the target second connection repair line positioned corresponding to the target gate line are welded, to make the target gate connection line electrically connected to the target gate line through the target gate repair line, the target first connection repair line, and the target second connection repair line.

Wherein, the gate lines and the at least one gate repair line are arranged in a same layer, and the gate connection lines and the at least one first connection repair line are arranged in a same layer.

An embodiment of the present application further provides a display panel, including:

a display region and a non-display region positioned at a side of the display region, wherein the display region includes: a plurality of gate lines extending laterally, at least one gate repair line, a plurality of gate connection lines extending longitudinally to the non-display region, and at least one first connection repair line extending longitudinally;

wherein the at least one gate repair line is connected to the at least one first connection repair line in a one-to-one correspondence, each of the at least one gate repair line is provided with a plurality of first connection repair points positioned in one-to-one correspondence with the gate connection lines, and each of the first connection repair lines is provided with a plurality of second connection repair points positioned in one-to-one correspondence with the gate lines; and wherein the at least one gate repair line and the at least one first connection repair line are connected to each other in a one-to-one correspondence through a plurality of first vias.

Wherein, the gate lines and the at least one gate repair line are arranged in a same layer, and the gate connection lines and the at least one first connection repair line are arranged in a same layer.

Wherein, orthographic projections of the gate connection lines on a level of the at least one gate repair line are intersected with each of the at least one gate repair line, and intersection positions are defined as first connection repair points.

Wherein, orthographic projections of the at least one first connection repair line on a level of the gate lines are intersected with each of the gate lines, and intersection positions are defined as second connection repair points.

Wherein, the at least one gate repair line is disposed at a side of the gate lines close to the non-display region.

Wherein, the at least one first connection repair line is disposed at at least one side of the gate connection lines.

Wherein, the display region further includes at least one second connection repair line extending longitudinally, the at least one first connection repair line and the at least one second connection repair line are arranged at opposite sides of the gate connection lines, respectively, the at least one gate repair line is connected to the at least one second connection repair line in one-to-one correspondence, and each of the at least one second connection repair line is provided with a plurality of third connection repair points positioned in one-to-one correspondence with the gate lines.

Wherein, orthographic projections of the at least one second connection repair line on a level of the gate lines are intersected with the gate lines, and intersection positions are defined as third connection repair points.

Beneficial Effect

Embodiments of the present application provide the display panel and the method of manufacturing the display panel, wherein the display panel includes a display region and a non-display region positioned at a side of the display region, wherein the display region includes a plurality of gate lines extending laterally, at least one gate repair line, a plurality of gate connection lines extending longitudinally to the non-display region, and at least one first connection repair line extending longitudinally; wherein the at least one gate repair line is connected to the at least one first connection repair line in a one-to-one correspondence, each of the at least one gate repair line is provided with a plurality of first connection repair points positioned in one-to-one correspondence with the gate connection lines, and each of the first connection repair lines is provided with a plurality of second connection repair points positioned in one-to-one correspondence with the gate lines. In this way, if a connection failure between a target gate line of the gate lines and a corresponding target gate connection line is detected, a target gate repair line is determined from the at least one gate repair line, one of the first connection repair lines connected to the target gate repair line is determined to be a target first connection repair line, and the first connection repair points on the target gate repair line positioned corresponding to the target gate connection line and the second connection repair points on the first connection repair line positioned corresponding to the target gate line are welded, to make the target gate connection line electrically connected to the target gate line through the target gate repair line and the target first connection repair line. Therefore, the target gate line with a failed connection continues to maintain an effective state, which solves the problems of poor contact or connection failure between the gate line and the gate connection line in the display panel, and improves the product yield of the display panel.

BRIEF DESCRIPTION OF FIGURES

In order to illustrate the technical solutions of the present application or the related art in a clearer manner, the drawings desired for the present application or the related art will be described hereinafter briefly. Obviously, the following drawings merely relate to some embodiments of the present application, and based on these drawings, a person skilled in the art may obtain the other drawings without any creative effort.

DETAILED DESCRIPTION OF EMBODIMENTS

The following content combines with the drawings and the embodiment for describing the present application in detail. It is obvious that the following embodiments are merely some embodiments of the present application, but not all the embodiments. Based on the embodiments in the present application, for the skilled persons of ordinary skill in the art without creative effort, the other embodiments obtained thereby are still covered by the present application.

In the description of the present application, it is to be understood that the terms such as "longitudinal", "lateral", "length", "width", "upper", "lower", "front", "rear", "left", "right", "vertical", "horizontal", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention. In addition, unless otherwise defined, any technical or scientific term used herein shall have the common meaning understood by a person of ordinary skills. Such words as "first" and "second" used in the specification and claims are merely used to differentiate different components rather than to represent any order, number or importance. In the description of the present application, the meaning of "plurality" is two or more unless specifically defined otherwise. In the present application, "/" means "or".

The present application may repeat reference numerals and/or reference letters in different examples. Such repetition is for the purpose of simplification and clarity, and does not indicate the relationship between the various embodiments and/or settings discussed.

Embodiments of the present application provide a display panel and a method of manufacturing the display panel to solve problems of poor contact or connection failure between gate lines and gate connection lines in an existing narrow border/no border display panel caused by process fluctuations in a manufacturing process, and improves a product yield of the display panel. The display panel and the method of manufacturing the display panel of the present application will be described in detail below in conjunction with specific embodiments.

Figure 1:
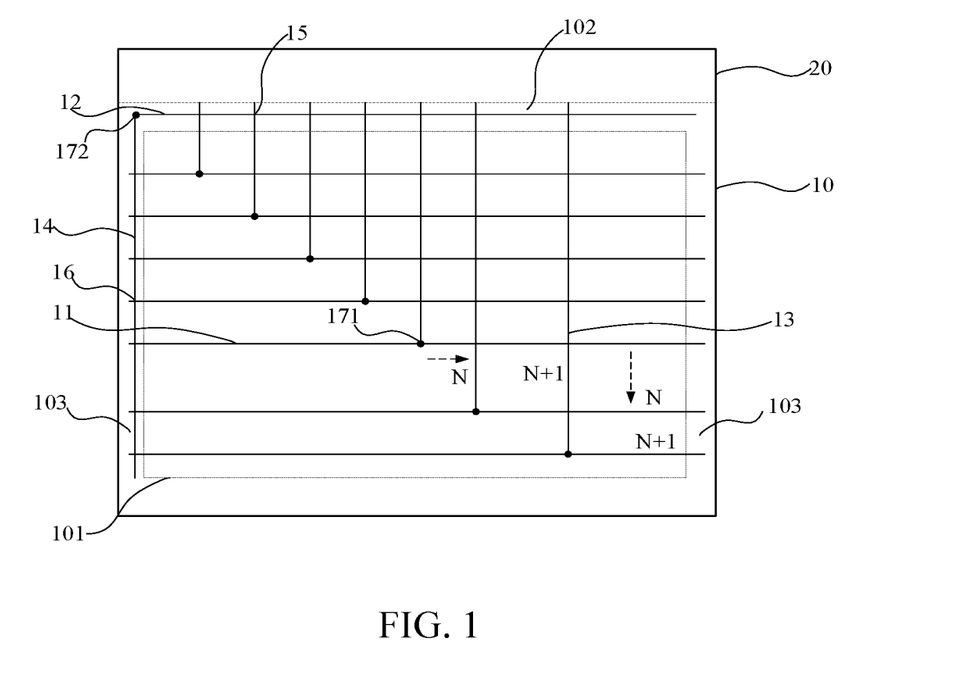
FIG. 1 is a schematic structural diagram of a display panel provided by an embodiment of the present application.
Figure 2:
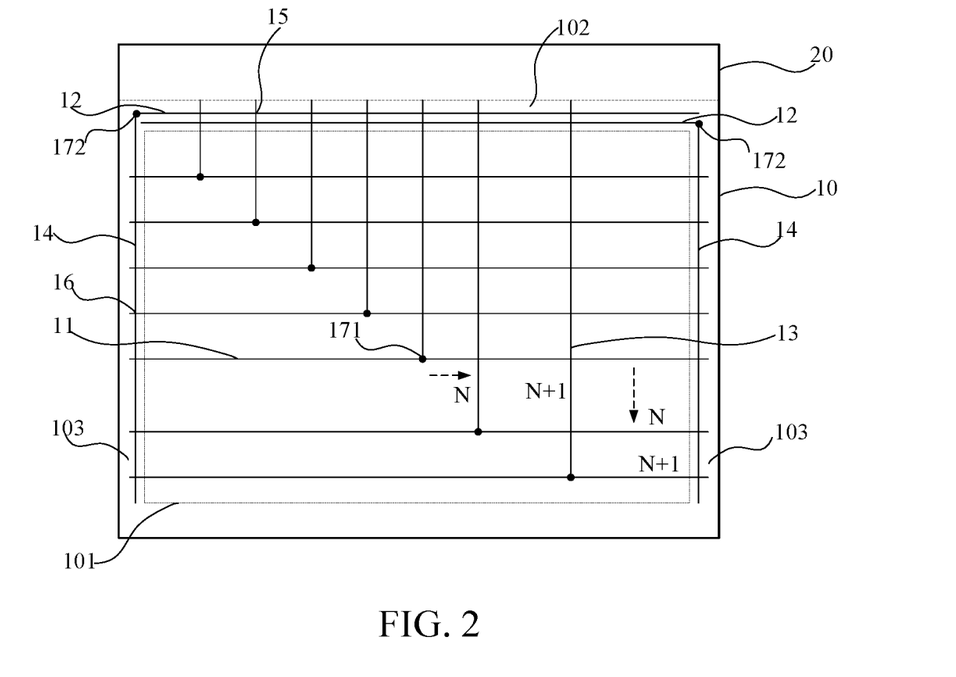
FIG. 2 is another schematic structural diagram of the display panel provided by an embodiment of the present application.
Figure 3:
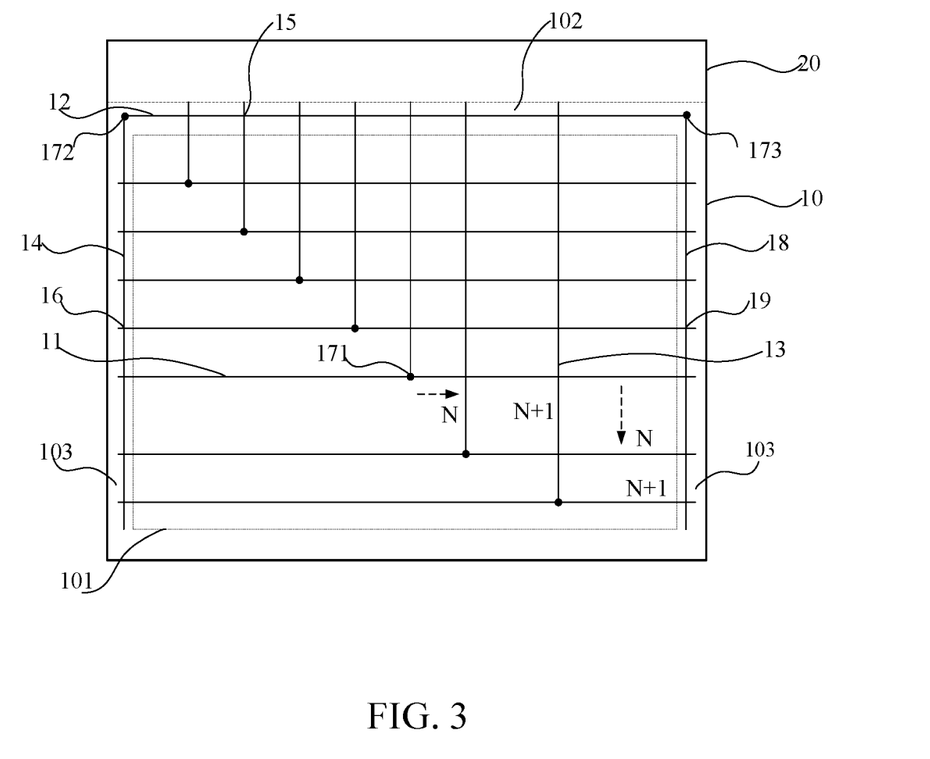
FIG. 3 is yet another schematic structural diagram of the display panel provided by an embodiment of the present application.

FIG. 1 to FIG. 3 are schematic diagrams of a configuration of a display panel provided by the embodiments of the present application. The display panel includes a display region 10 and a non-display region 20 disposed on a side of the display region 10. The display region 10 includes a first display region 101 positioned corresponding to a middle region of the display panel, a source border region 102 positioned between the first display region 101 and the non-display region 20, and gate border regions 103 are arranged at opposite sides of the first display region 101 and adjacent to the source border region 102. Wherein, the first display region 101 is configured to provide display of the display panel.

The display region 10 includes a plurality of gate lines 11 extending laterally and a plurality of gate connection lines 13 extending longitudinally to the non-display region 20. The gate connection lines 13 are connected to the gate lines 11 in one-to-one correspondence. The gate lines 11 and the gate connection lines 13 are arranged on different layers, for example, the gate lines 11 are arranged on a first metal layer on a base substrate, and the gate connection lines 13 are arranged on a second metal layer on a side of the first metal layer away from the base substrate. The non-display region 20 includes a gate driver on array (GOA) driving circuit/gate chip-on-film (GCOF) driving circuit for providing gate driving signals for the display region 10. An end of each of the gate connection lines 13 is connected to the GOA driving circuit in the non-display region 20, and is configured to receive the gate driving signals provided by the non-display region 20. The other ends of the gate connection lines 13 are connected to the gate lines 11 in a one-to-one correspondence through connection vias 171, and are configured to transmit the received gate driving signals to the correspondingly connected gate lines 11.

The display region 10 further includes at least one gate repair line 12 extending laterally, at least one first connection repair line 14 extending longitudinally, and at least one gate repair line 12 is connected to the at least one first connection repair line 14 in a one-to-one correspondence. Each of the gate repair line 12 is provided with a plurality of first connection repair points 15 positioned in one-to-one correspondence with the gate connection lines 13, and each of the first connection repair lines 14 is provided with a plurality of second connection repair points 16 positioned in one-to-one correspondence with the gate lines 11.

The display region 10 also includes a plurality of data lines extending longitudinally (not shown in the figure), the data lines and the gate connection lines 13 are arranged in a same layer, and the data lines and the gate lines 11 are arranged in different layers. The non-display region 20 positioned on a side of the display region 10 further includes a source driving circuit, and the data lines are connected to the source driving circuit in the non-display region 20 for providing data signals. In the embodiment of the present application, the GOA driving circuit and the source driving circuit are arranged on the side of the display region to reduce the border on the other side of the display region to achieve the purpose of narrow border/no border.

The above-mentioned display panels in FIG. 1 to FIG. 3 are high-resolution display panels, and connection vias 13 inside the panels are very dense, and considering an aperture ratio inside the panels, the connection vias 171 need to be very small, such as less than 3*3 um, etc., which exceeds the limitation of a conventional via process capability. Due to a process fluctuation of manufacturing the connection vias and/or other process fluctuations, the gate lines 11 of the first metal layer and the gate connection lines 13 of the second metal layer in the display panel are likely to result in poor contact or connection failure. For example, the connection vias 171 connecting the gate lines 11 in the first metal layer to the gate connection lines 13 in the second metal layer are defective, resulting in the gate lines 11 in the first metal layer and the gate connection lines 13 in the second metal layer to fail to conduct; or the gate lines 11 in the first metal layer and the gate connection lines 13 in the second metal layer may be short-circuited due to foreign matter such as particles, resulting in the gate lines 11 in the first metal layer and the gate connection lines 13 in the second metal layer to fail to conduct; or the gate connection lines 13 in the second metal layer are broken, which causes the gate lines 11 in the first metal layer and the gate connection lines 13 in the second metal layer to fail to conduct.

When poor contact or connection failure occurs between one of the gate lines 11 in the first metal layer and one of the gate connection lines 13 in the second metal layer on the display panel, the poor contact or connection failure cannot be detected immediately by a current detection technology. However, during a lighting test, it can be seen that the display panel is abnormal due to poor contact or connection failure of the gate line and the gate connection line. In this way, it is easy to cause the display panel to be scrapped, which reduces the product yield of the display panel. On the other hand, the ultra-narrow border/no border has no solution proposed to fix the poor contact or connection failure in a verification stage.

In the display panel provided in the embodiment of the present application, if a connection failure between a target gate line of the gate lines and a corresponding target gate connection line is detected, a target gate repair line is determined from the at least one gate repair line, one of the first connection repair lines connected to the target gate repair line is determined to be a target first connection repair line, and the first connection repair points on the target gate repair line positioned corresponding to the target gate connection line and the second connection repair points on the first connection repair line positioned corresponding to the target gate line are welded, to make the target gate connection line electrically connected to the target gate line through the target gate repair line and the target first connection repair line. Therefore, the target gate line with a failed connection continues to maintain an effective state, which solves the problems of poor contact or connection failure between the gate line and the gate connection line in the display panel, and improves the product yield of the display panel.

Wherein, the gate lines 11 and the at least one gate repair line 12 are arranged in a same layer. It can be understood that the gate lines 11 and the at least one gate repair line 12 are formed through a same photomask process. The gate connection lines 13 and the at least one first connection repair line 14 are arranged in a same layer. It can be understood that the gate connection lines 13 and the at least one first connection repair line 14 are formed by a same photomask process. In this way, there is no need to add additional processes to form the at least one gate repair line 12 and the at least one first connection repair line 14. It can be understood that the gate lines 11 and the at least one connection repair line 12 are disposed on different layers from the gate connection lines 13 and the at least one first connection repair line 14.

Specifically, at least one gate repair line 12 can be arranged between the gate lines 11, for example, one gate repair line is arranged between a first gate line and a second gate line, and a gate repair line is also arranged between the gate second line and a third gate line, that is, a gate repair line is provided between any two of adjacent gate lines, specifically, one gate repair line is disposed between any two rows of pixel openings. The at least one gate repair line 12 can also be disposed at a side of the gate lines 12 close to the non-display region 20.

Preferably, in order to reduce length of lines and prevent display effect of the display region 10 from being affected, at least one gate repair line 12 is disposed at the side of the gate lines 11 close to the non-display region 20, as shown in FIG. 1 to FIG. 3. It can be simply understood that, at least one gate repair line 12 extending laterally is designed and added in the source border region 102 according to a design space and requirements of the source border region 102.

Specifically, at least one first connection repair line 14 can be arranged between the gate connection lines 13, that is, one of the first connection repair line is arranged between any two gate connection lines, specifically, one of the first connection repair line is disposed between any two columns of pixel openings. The at least one first connection repair line 14 can also be disposed at a side of the gate connection lines 13.

Preferably, in order to prevent the display effect of the display region 10 from being affected, at least one first connection repair line 14 is disposed at at least one side of the gate connection lines 13. It can be simply understood as extending the design of the base substrate and the gate lines 11, etc. into the gate border region 103 positioned at at least one side of the display panel to form the configuration shown in FIG. 1 to FIG. 3. According to the design space and requirements of the gate border region 103, at least one first connection repair line 14 extending longitudinally is designed to be added to at least one gate border region 103.

Figure 4:
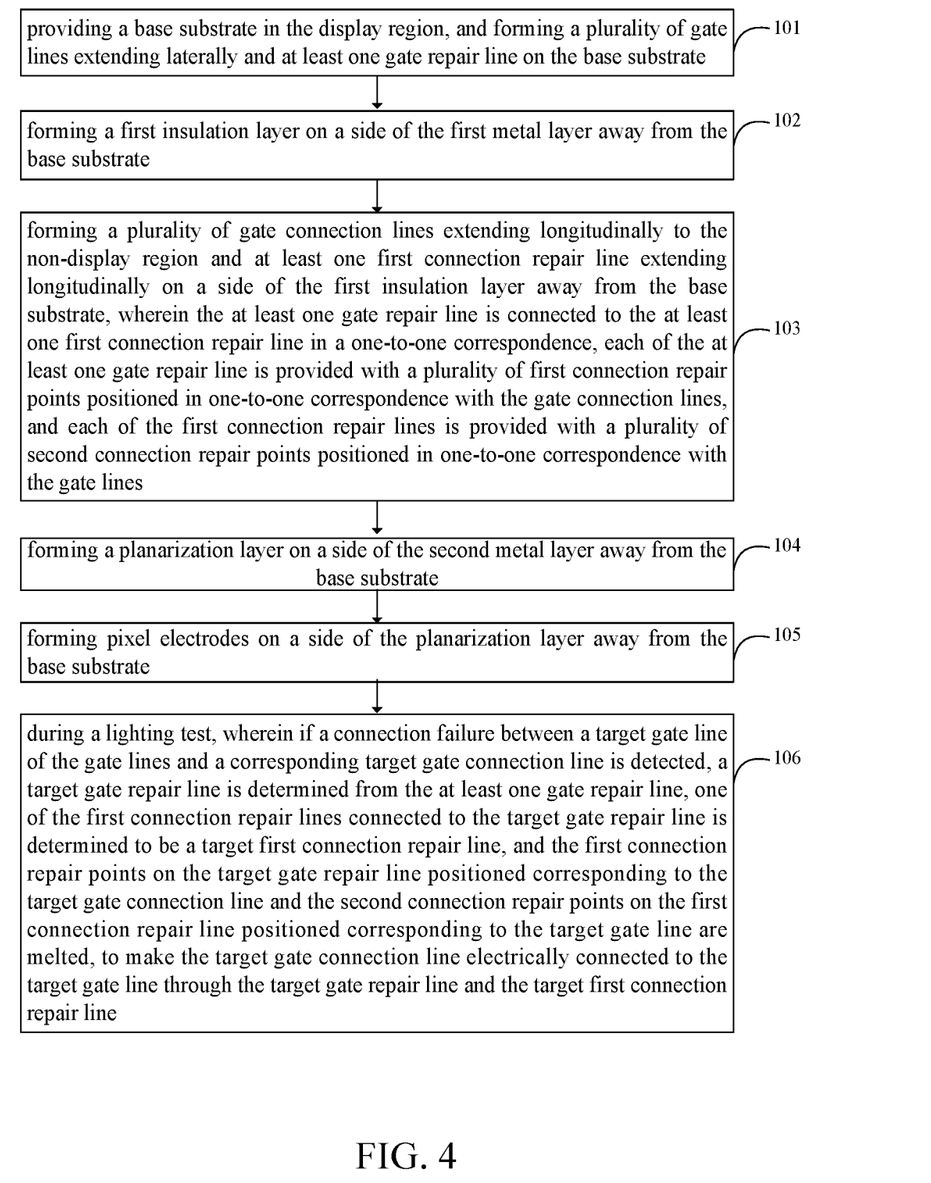
FIG. 4 is a schematic flowchart of a method of manufacturing a display panel provided by an embodiment of the present application.
Figure 5:
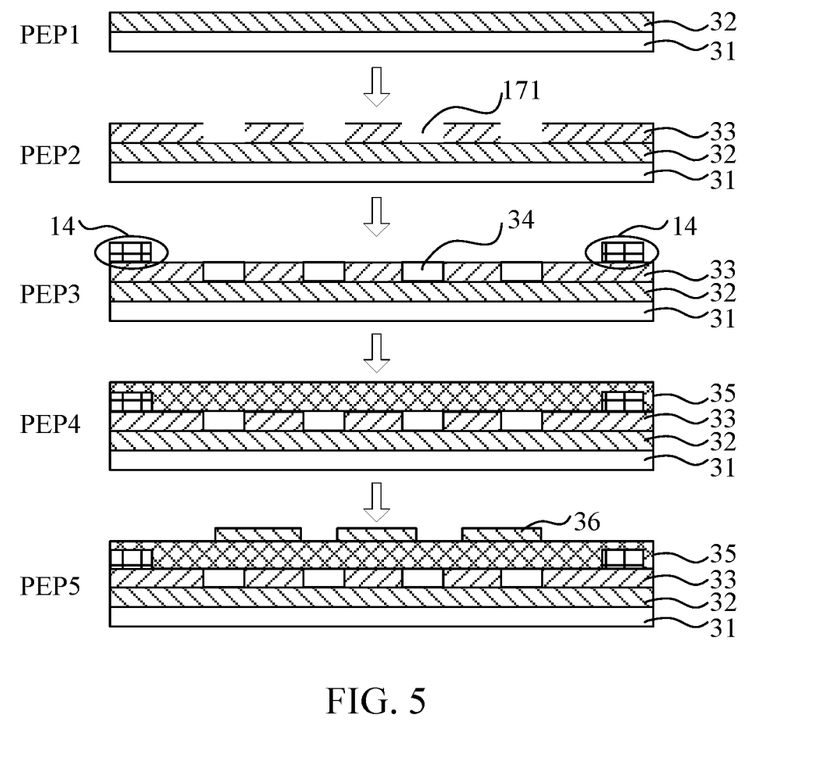
FIG. 5 is a schematic diagram of part of a manufacturing process and corresponding structures for forming a display region of the display panel provided by an embodiment of the present application.

As shown in FIG. 3, at least one first connection repair line 14 is disposed at a left side of the gate connection lines 13, that is, at least one first connection repair line 14 is disposed on the gate border region 103 positioned at a left side of the first display region 101. Understandably, at least one first connection repair line 14 can also be disposed at a right side of the gate connection lines 13, that is, at least one first connection repair line 14 is disposed on the gate border region 103 positioned at a right side of the first display region 101 (this situation is not shown in the figure). As shown in FIG. 4, at least one first connection repair line 14 is disposed at opposite sides of the gate connection lines 13, that is, the gate border regions 103 positioned on the left side and the right side of the first display region 101 are provided with at least one first connection repair line 14. As shown in FIG. 5, at least one first connection repair line 14 is disposed at the side of the gate connection lines 13, such as at the left side of the gate connection lines 13, that is, at least one first connection repair line 14 is disposed on the gate border region 103 positioned at the left side of the first display region 101.

It can be easily understood that the gate lines 11 in the embodiment of the present application are designed to extend into the gate border region 103 positioned at the left side of the display panel, and are designed to extend into the gate border region 103 positioned at the right side of the display panel to form the configuration in FIG. 1 to FIG. 3, or can also be understood as the gate lines 11 extend out of the first display region 101 from the left side of the first display region 101 of the display panel, and extend out of the first display region 101 from the right side of the first display region 101 of the display panel, to form the configuration in FIG. 1 to FIG. 3. Understandably, if at least one first connection repair line 14 is disposed at the left side of the gate connection lines 13, correspondingly, the gate lines 11 can only be designed to extend into the gate border region 103 positioned on the left side of the display panel. Or, it can also be understood that the gate lines 11 extend out of the first display region 101 from the left side of the first display region 101 of the display panel (this situation is not shown in the figure). If at least one first connection repair line 14 is disposed at the right side of the gate connection lines 13, correspondingly, the gate lines 11 can only be designed to extend into the gate border region 103 positioned on the right side of the display panel, or it can be understood that the gate lines 11 extend out of the first display region 101 from the right side of the first display region 101 of the display panel (this situation is not shown in the figure). It should be noted that only extension of the gate lines 11 is mentioned here, it is understandable that physical components in all levels of the first display region extend synchronously with the gate lines.

Specifically, as shown in FIG. 1 to FIG. 3, at least one gate repair line 12 and at least one first connection repair line 14 are connected in a one-to-one correspondence through first vias 172. Orthographic projections of the gate connection lines 13 on a level of the gate repair line 12 are intersected with each gate repair line of the gate repair lines 12, and intersection positions are defined as first connection repair points 15. Orthographic projections of the at least one first connection repair line 14 on a level of the gate lines 11 are intersected with each of the gate lines 11, and intersection positions are defined as second connection repair points 16.

During the lighting test, if a connection failure between a target gate line of the gate lines 13 and a corresponding target gate connection line is detected, a target gate repair line is determined from the at least one gate repair line 12, one of the first connection repair lines connected to the target gate repair line is determined to be a target first connection repair line, and the first connection repair points on the target gate repair line positioned corresponding to the target gate connection line and the second connection repair points on the first connection repair line positioned corresponding to the target gate line are welded, to make the target gate connection line electrically connected to the target gate line through the target gate repair line and the target first connection repair line. Therefore, even if the target gate connection line in the display region is in poor contact or connection failure with the corresponding target gate line, the gate driving signals received by the target gate connection line can still be transmitted to the target gate line through the target gate repair line and the target first connection repair line, and then, the target gate line with a failed connection continues to maintain an effective state, which solves the problems of poor contact or connection failure between the gate line and the gate connection line in the display panel, and improves the product yield of the display panel.

In the display panel shown in FIG. 5, in addition to at least one first connection repair line 14 extending longitudinally being disposed at the side of the gate connection lines 13, at least one second connection repair line 18 extending longitudinally is also disposed at the other side of the gate connection lines 13, and at least one first connection repair line 14 and at least one second connection repair line 18 are disposed at opposite sides of the gate connection lines 13. For example, at least one first connection repair line 14 is disposed at the left side of the gate connection lines 13, and at least one second connection repair line 18 is disposed at the right side of the gate connection lines 13. At least one gate repair line 12 is connected to at least one second connection repair line 18 in a one-to-one correspondence, and each of the second connection repair line 18 is provided with a plurality of third connection repair points 19 positioned in one-to-one correspondence with the gate lines 11. The gate connection lines and at least one second connection repair line 18 are arranged in a same layer.

Specifically, at least one gate repair line 12 and at least one second connection repair line 18 are connected to each other in a one-to-one correspondence through second vias 173, and orthographic projections of at least one second connection repair line 12 on a level of the gate lines 11 are intersected with the gate lines 11, and intersection positions are defined as third connection repair points 19.

It is understandable that, as shown in FIG. 1 to FIG. 2, each of the gate repair line 12 is connected to one of the first connection repair line through the first via 172, which is understood that the display panel shown in FIG. 1 to FIG. 2 is single driving. In FIG. 3, each of the gate repair line 12 is connected to one of the first connection repair line 14 through the first via 172, and is connected to one of the second connection repair line 18 through the second via 173 at the same time, which is understood that the display panel shown in FIG. 3 is dual-driving.

For the display panel shown in FIG. 3, if a connection failure between a target gate line of the gate lines 13 and a corresponding target gate connection line is detected, a target gate repair line is determined from the at least one gate repair line 12, one of the first connection repair lines connected to the target gate repair line is determined to be a target first connection repair line, one of the second connection repair lines connected to the target gate repair line to be a target second connection repair line, the first connection repair points on the target gate repair line positioned corresponding to the target gate connection line are welded, the second connection repair points on the first connection repair line positioned corresponding to the target gate line are welded, and the third connection repair points on the target second connection repair line positioned corresponding to the target gate line are welded, to make the target gate connection line electrically connected to the target gate line through the target gate repair line, the target first connection repair line, and the target second connection repair line. Therefore, even if the target gate connection line in the display region is in poor contact or connection failure with the corresponding target gate line, the gate driving signals received by the target gate connection line can still be transmitted to the target gate line through the target gate repair line, the target first connection repair line, and the target second connection repair line, and then, the target gate line with a failed connection continues to maintain an effective state, which solves the problems of poor contact or connection failure between the gate line and the gate connection line in the display panel, and improves the product yield of the display panel.

The above-mentioned display panel shown in FIG. 1 to FIG. 3 solves the problems of poor contact or connection failure between the gate line and the gate connection line in the display panel, and improves the product yield of the display panel.

An embodiment of the present application further provides a method of manufacturing a display panel, the display panel including a display region 10 and a non-display region 20, as shown in FIG. 4, the method of manufacturing the display panel includes following steps 101 to 106. FIG. 5 is a schematic diagram of part of a manufacturing process and corresponding structures for forming the display region of the display panel provided by the embodiment of the present application. Refer to the method of manufacturing the display panel in conjunction with FIG. 4 and FIG. 5.

101, providing a base substrate in the display region, and forming a plurality of gate lines extending laterally and at least one gate repair line on the base substrate.

The base substrate 31 is provided in the display region, a first metal film is formed on the base substrate 31, and a first metal layer 32 is formed on the first metal film through a first photomask process (PEP1). The first metal layer 32 includes a plurality of gate lines 11 extending laterally and at least one gate repair line 12 extending laterally. Preferably, in order to reduce length of lines and prevent the display effect of the display region 10 from being affected, at least one gate repair line 12 is formed on the side of the gate lines 11 close to the non-display region 20.

102, forming a first insulation layer on a side of the first metal layer away from the base substrate.

The first insulation layer 33 is formed on the side of the first metal layer 32 away from the base substrate 31 by a deposition process, and a plurality of connection vias 171 are defined on the first insulation layer 33 by a second photomask process (PEP2).

103, forming a plurality of gate connection lines extending longitudinally to the non-display region and at least one first connection repair line extending longitudinally on a side of the first insulation layer away from the base substrate, wherein the at least one gate repair line is connected to the at least one first connection repair line in a one-to-one correspondence, each of the at least one gate repair line is provided with a plurality of first connection repair points positioned in one-to-one correspondence with the gate connection lines, and each of the first connection repair lines is provided with a plurality of second connection repair points positioned in one-to-one correspondence with the gate lines.

A second metal film is formed on the side of the first insulation layer 33 away from the base substrate 31, and a second metal layer 34 is formed on the second metal film through a third photomask process (PEP3). The second metal layer 34 includes the gate connection lines 13 extending longitudinally to the non-display region 20 and at least one first connection repair line 14 extending longitudinally. The gate connection lines 13 in the second metal layer 34 are electrically connected to the gate lines 11 in the first metal layer 32 through the connection vias 171.

At least one gate repair line 12 is connected to the at least one first connection repair line 14 in a one-to-one correspondence, each of the at least one gate repair line is provided with a plurality of first connection repair points 15 positioned in one-to-one correspondence with the gate connection lines, and each of the first connection repair lines is provided with a plurality of second connection repair points 16 positioned in one-to-one correspondence with the gate lines. Specifically, orthographic projections of the gate connection lines 13 on a level of the gate repair line 12 are intersected with each of the gate repair lines, and intersection positions are defined as the first connection repair points 15. Orthographic projections of the at least one first connection repair line 14 on a level of the gate lines 11 are intersected with each of the gate lines, and intersection positions are defined as the second connection repair points 16.

Preferably, in order to prevent the display effect of the display region 10 from being affected, at least one gate repair line 12 is formed on at least one side of the gate lines 11. For example, at least one gate repair line 12 is formed on a left side of the gate lines 11 (corresponding to the display panel in FIG. 1), a right side of the gate lines (not shown in the figure), or the left side and the right side of the gate lines (corresponding to the display panel in FIG. 2). As corresponding to the display panel shown in FIG. 2, at least one first connection repair line 14 is formed on the left side and the right side of the gate connection lines 13.

104, forming a planarization layer on a side of the second metal layer away from the base substrate.

The planarization layer 35 is formed on the side of the second metal layer 34 away from the base substrate 31 through a fourth photomask process (PEP4).

105, forming pixel electrodes on a side of the planarization layer away from the base substrate.

The pixel electrodes 36 are formed on the side of the planarization layer 35 away from the base substrate 31 through a fifth photomask process (PEP5).

It should be noted that in addition to the manufacturing process shown in FIG. 5, the method of manufacturing the display panel also includes other manufacturing processes, and the formed display region can also include more layers. For example, a second insulation layer (not shown in the figure) is formed on the side of the second metal layer 34 away from the base substrate 31, and a third metal layer (not shown in the figure) is formed on the second insulation layer through a sixth photomask process. The third metal layer includes formed silicon islands (not shown in the figure).

Then, the planarization layer 35 is formed on a side of the third metal layer away from the base substrate.

106, during a lighting test, wherein if a connection failure between a target gate line of the gate lines and a corresponding target gate connection line is detected, a target gate repair line is determined from the at least one gate repair line, one of the first connection repair lines connected to the target gate repair line is determined to be a target first connection repair line, and the first connection repair points on the target gate repair line positioned corresponding to the target gate connection line and the second connection repair point on the first connection repair line positioned corresponding to the target gate line are welded, to make the target gate connection line electrically connected to the target gate line through the target gate repair line and the target first connection repair line.

Wherein, in the product manufacturing process, an inspection machine detects whether there is a connection failure between the target gate line and the corresponding target gate connection line or not. If it exists, a number of target gate connection lines is determined. The number of target gate connection lines may be one or more. If the number of target gate connection lines is not greater than a number of gate repair lines, then a number of target gate repair lines is determined from the at least one gate repair line 12 which the number is same as the number of target gate connection lines, and the first connection repair line connected to the target gate repair line is determined as the target first connection repair line. If the number of target gate connection lines is greater than the number of gate repair lines 12, the number of target gate connection lines is five and the number of gate repair lines 12 is four for example, which means that the formed gate repair lines 12 are not enough to repair all the target gate lines with failed connections. Then, redefining the target gate connection lines that can be repaired and the corresponding target gate lines, determining all the gate repair lines as the target gate repair lines, and determining the first connection repair line connected to the target gate repair line to be the target first connection repair line.

Specifically, the target gate connection line that can be repaired and the corresponding target gate line is re-determined, a corresponding number of connection failed target gate line and target gate connection line can be randomly determined from connection failed gate line and gate connection line. Alternatively, taking a corresponding number of connection failed gate line positioned close to a center of the display panel as the target gate line, and taking the gate connection line corresponding to the target gate line as the target gate connection line, in this way, to minimize the impact on the display effect of the display region. Understandably, an influence of connection failure of a gate line and a corresponding gate connection line positioned in the central region of the display panel has a greater impact on the display effect than an influence of connection failure of a gate line and a corresponding gate connection line positioned in a peripheral region of the display panel.

Figure 6:
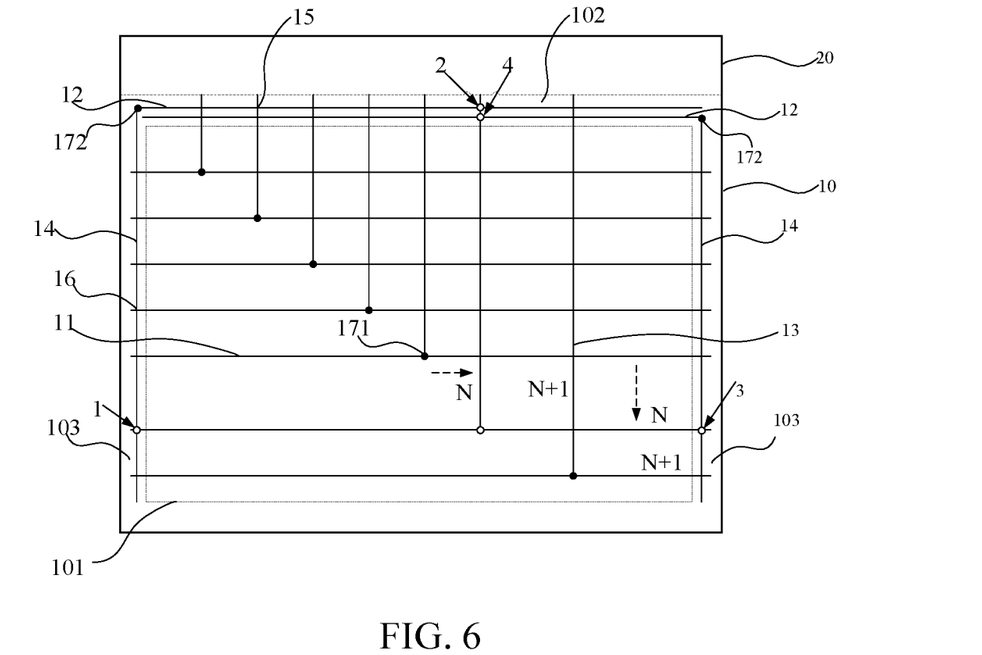
FIG. 6 is a schematic diagram of a repair structure provided by an embodiment of the present application.
Figure 7:
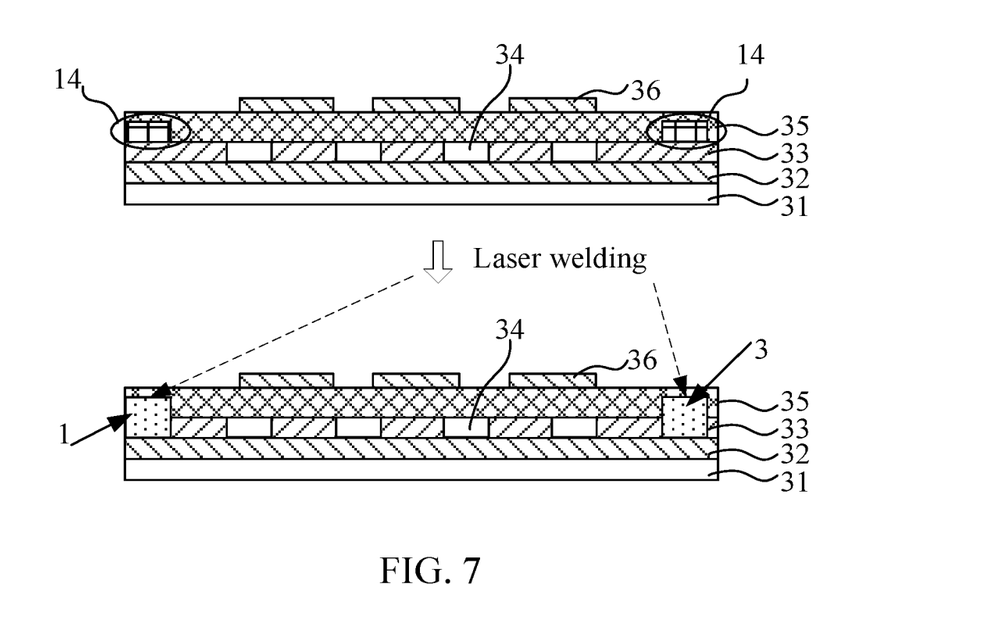
FIG. 7 is a schematic structural diagram of a welding provided by an embodiment of the present application.

FIG. 6 is a schematic diagram of a repair structure provided by an embodiment of the present application, and FIG. 7 is a schematic diagram of a welding structure corresponding to FIG. 6 provided by an embodiment of the present application. As shown in FIG. 6 (FIG. 6 corresponds to the display panel in FIG. 2), assuming that a connection between an N-th gate line and a corresponding N-th gate connection line is failed, then the N-th gate line and the corresponding N-th gate connection line are determined as the target gate line and the target gate connection line. One target gate repair line is determined from at least one gate repair line 12, and one of the first connection repair line connected to the target gate repair line is determined as the target first connection repair line. For example, after the target gate repair line is determined, the target first connection repair line connected to the target gate repair line is positioned on the left side of the display panel; or after the target gate repair line is determined, the target first connection repair line connected to the target gate repair line is positioned on the right side of the display panel. It should be noted that the target gate repair line corresponding to the target first connection repair line positioned on the left side of the display panel and the target gate repair line corresponding to the target first connection repair line positioned on the right side of the display panel are different target gate repair lines.

If the target gate repair line is determined and the target first connection repair line is positioned on the left side of the display panel, then the second connection repair point on the first connection repair line positioned corresponding to the target gate line is positioned on the left side of the display panel, such as point 1 shown in FIG. 6, the first connection repair point on the target gate repair line positioned corresponding to the target gate connection line is shown as point 2 in FIG. 6. As shown in FIG. 7, a laser welding process is configured to weld point 1 and point 2 (point 2 is not shown in FIG. 7). Wherein, welding point 2 to make the target gate connection line electrically connected to the target gate repair line, and welding point 1 to make the target first connection repair line connected to the target gate repair line electrically connected to the target gate line.

If the target gate repair line is determined, the target first connection repair line is positioned on the right side of the display panel, then the second connection repair point on the first connection repair line positioned corresponding to the target gate line is positioned on the right side of the display panel, such as point 3 shown in FIG. 6, the first connection repair point on the target gate repair line positioned corresponding to the target gate connection line is shown as point 4 in FIG. 6. As shown in FIG. 7, using the laser welding process to weld point 3 and point 4 (point 4 is not shown in FIG. 7). Wherein, welding point 4 to make the target gate connection line electrically connected to the target gate repair line, and welding point 3 to make the target first connection repair line connected to the target gate repair line electrically connected to the target gate line.

It should be noted that the display panel shown in FIG. 6 is single driving, welding point 1 and point 2, or welding point 3 and point 4 can be achieved to repair the target gate line and the target gate connection line, so that the target gate connection line is electrically connected to the target gate line through the target gate repair line and the target first connection repair line, and the gate driving signals received by the target gate connection line are transmitted to the target gate line through the target gate repair line and the target first connection repair line. It should be noted that welding point 1 and point 2, and welding point 3 and point 4 in FIG. 6 are two different embodiments that can solve technical problems.

Figure 8:
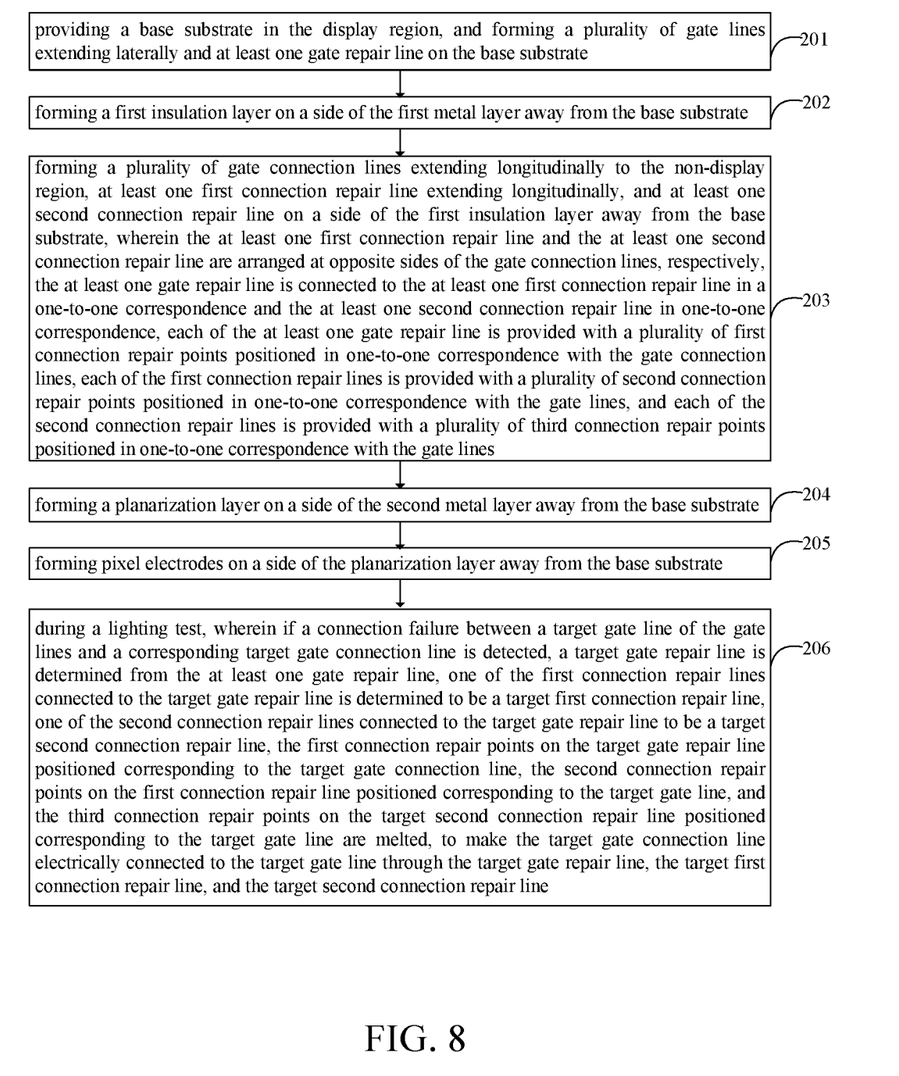
FIG. 8 is another schematic flowchart of a method of manufacturing a display panel provided by an embodiment of the present application.
Figure 9:
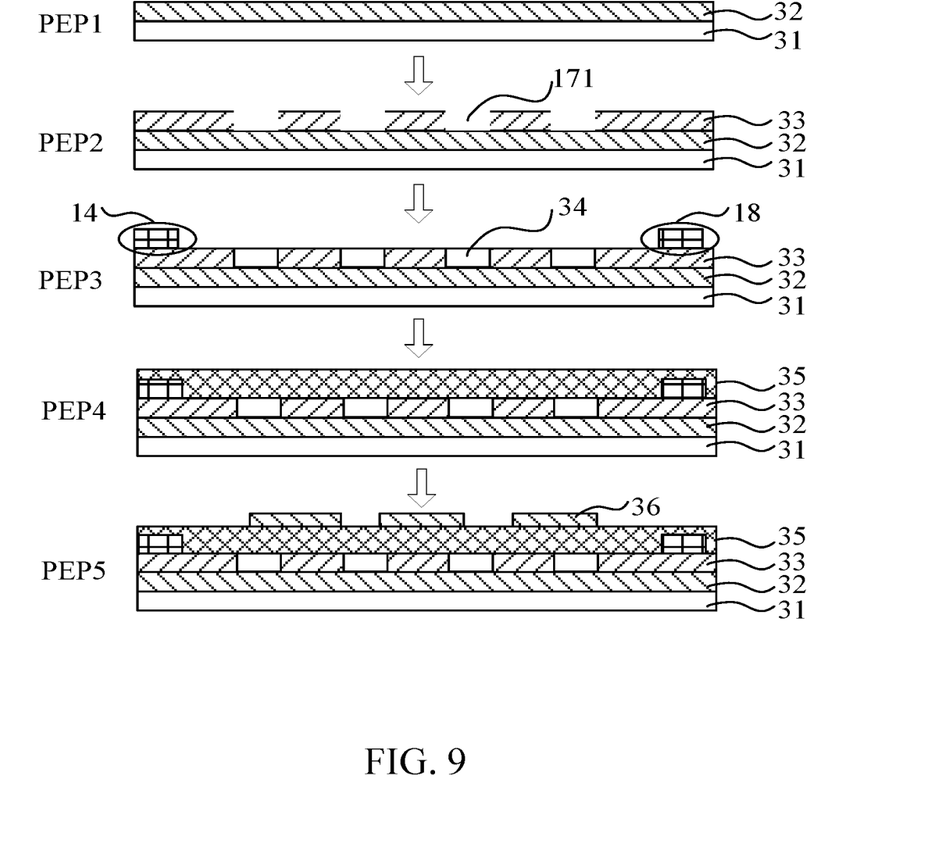
FIG. 9 is a schematic diagram of part of another manufacturing process and corresponding structures for forming a display region of the display panel provided by an embodiment of the present application.

The embodiment of the present application further provides a method of manufacturing a display panel. The display panel includes a display region 10 and a non-display region 20. As shown in FIG. 8, the method of manufacturing the display panel includes following steps 201 to 206. FIG. 9 is a schematic diagram of part of another manufacturing process and corresponding structures for forming the display region of the display panel provided by an embodiment of the present application. Refer to the method of manufacturing the display panel in conjunction with FIG. 8 and FIG. 9.

201, providing a base substrate in the display region, and forming a plurality of gate lines extending laterally and at least one gate repair line on the base substrate.

202, forming a first insulation layer on a side of the first metal layer away from the base substrate.

203, forming a plurality of gate connection lines extending longitudinally to the non-display region, at least one first connection repair line extending longitudinally, and at least one second connection repair line on a side of the first insulation layer away from the base substrate, wherein the at least one first connection repair line and the at least one second connection repair line are arranged at opposite sides of the gate connection lines, respectively, the at least one gate repair line is connected to the at least one first connection repair line in a one-to-one correspondence and the at least one second connection repair line in one-to-one correspondence, each of the at least one gate repair line is provided with a plurality of first connection repair points positioned in one-to-one correspondence with the gate connection lines, each of the first connection repair lines is provided with a plurality of second connection repair points positioned in one-to-one correspondence with the gate lines, and each of the second connection repair lines is provided with a plurality of third connection repair points positioned in one-to-one correspondence with the gate lines.

Specifically, the second metal layer 34 is formed on the side of the first insulation layer 33 away from the base substrate 31, and the gate connection lines 13 extending longitudinally to the non-display region 20, at least one first connection repair line 14 extending longitudinally, and at least one second connection repair line 18 extending longitudinally are formed in the second metal layer 34 through the third photomask process (PEP3). At least one first connection repair line 14 and at least one second connection repair line 18 are formed on opposite sides of the gate connection lines 13, and at least one gate repair line 12 is connected to at least one first connection in a one-to-one correspondence through the first via 172. At least one gate repair line 12 is connected to at least one second connection repair line 18 in a one-to-one correspondence through the second via 173. The gate connection lines 13 in the second metal layer 34 are electrically connected to the gate lines 11 in the first metal layer 32 through the connection vias 171. It should be noted that the third mask here is different from the third mask shown in FIG. 5.

Corresponding to the display panel shown in FIG. 3, at least one first connection repair line 14 is formed on the left side of the gate connection lines 13, and at least one second connection repair line 18 is formed on the right side of the gate connection lines 13. Corresponding to the display region shown in FIG. 9, at least one first connection repair line 14 is formed on the left side of the gate connection lines 13 in the second metal layer 34, and at least one second connection repair line 18 is formed on the right side of the gate connection lines 13 in the second metal layer 34.

Wherein, each of the gate repair line 12 is provided with the first connection repair points 15 positioned in one-to-one correspondence with the gate connection lines 13, each of the first connection repair lines 14 is provided with the second connection repair points 16 positioned in one-to-one correspondence with the gate lines 11, and each of the second connection repair lines 18 is provided with the third connection repair points 19 positioned in one-to-one correspondence with the gate lines 11. Specifically, orthographic projections of the gate connection lines 13 on the level of the gate repair line 12 are intersected with each of the gate repair lines, and intersection positions are defined as the first connection repair points 15. Orthographic projections of the at least one first connection repair line 14 on the level of the gate lines 11 are intersected with the gate lines 11, and intersection positions are defined as the second connection repair points 16. Orthographic projections of at least one second connection repair line 12 on the level of the gate lines 11 are intersected with the gate lines 11, and intersection positions are defined as the third connection repair points 19.

204, forming a planarization layer on a side of the second metal layer away from the base substrate.

205, forming pixel electrodes on a side of the planarization layer away from the base substrate.

206, during a lighting test, wherein if a connection failure between a target gate line of the gate lines and a corresponding target gate connection line is detected, a target gate repair line is determined from the at least one gate repair line, one of the first connection repair lines connected to the target gate repair line is determined to be a target first connection repair line, one of the second connection repair lines connected to the target gate repair line to be a target second connection repair line, the first connection repair points on the target gate repair line positioned corresponding to the target gate connection line, the second connection repair points on the first connection repair line positioned corresponding to the target gate line, and the third connection repair points on the target second connection repair line positioned corresponding to the target gate line are welded, to make the target gate connection line electrically connected to the target gate line through the target gate repair line, the target first connection repair line, and the target second connection repair line.

Wherein, the method of detecting the target gate line and the target gate connection line, and the method of determining the target gate line, the target gate connection line, the target gate repair line, the target first connection repair line, the target second connection repair line, etc., are consistent with the method in step 106 and will not be repeated here.

Figure 10:
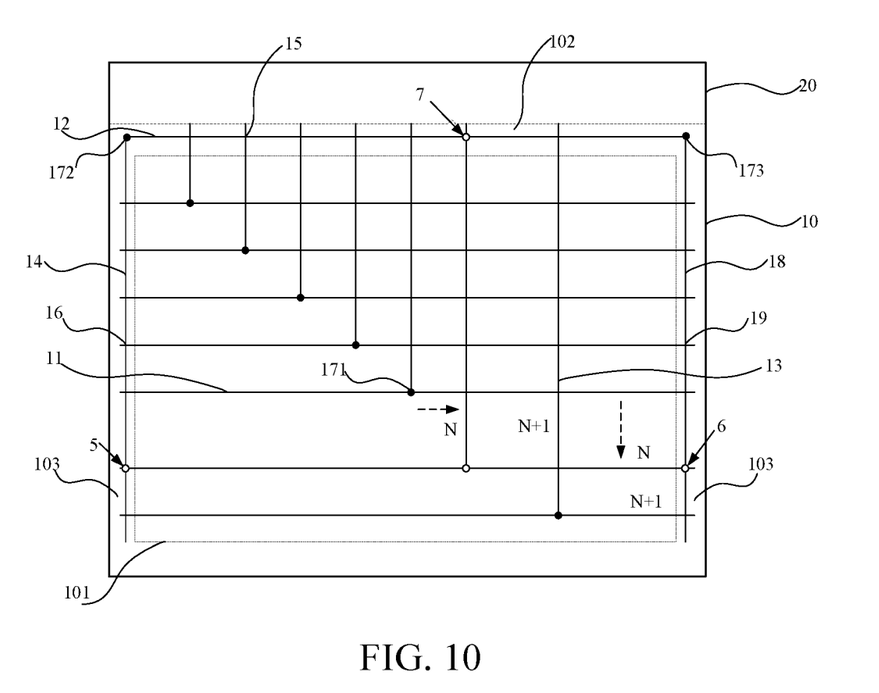
FIG. 10 is a schematic diagram of another repair structure provided by an embodiment of the present application.
Figure 11:
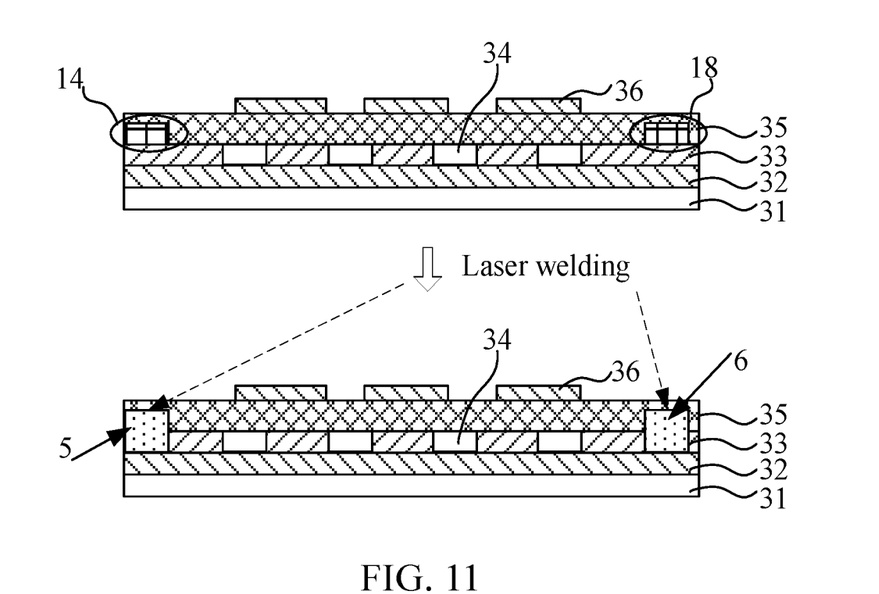
FIG. 11 is a schematic structural diagram of another welding provided by an embodiment of the present application.

FIG. 10 is a schematic diagram of a repair structure provided by an embodiment of the present application, and FIG. 11 is a schematic diagram of a welding corresponding to FIG. 10 provided by an embodiment of the present application. As shown in FIG. 10 (FIG. 10 corresponds to the display panel in FIG. 3), assuming that a connection between an N-th gate line and a corresponding N-th gate connection line is failed, then the N-th gate line and the corresponding N-th gate connection line are determined as the target gate line and the target gate connection line. One target gate repair line is determined from at least one gate repair line 12, and the first connection repair line and the second connection repair line connected to the target gate repair line are determined as the target first connection repair line and the target second connection repair line. For example, after the target gate repair line is determined, the target first connection repair line connected to the target gate repair line is positioned on the left side of the display panel, and the target second connection repair line connected to the target gate repair line is positioned on the right side of the display panel. It should be noted that the target first connection repair line and the target second connection repair line are connected to a same target gate repair line.

If the target gate repair line is determined and the target first connection repair line is positioned on the left side of the display panel, then the second connection repair point on the first connection repair line positioned corresponding to the target gate line is positioned on the left side of the display panel, such as point 5 shown in FIG. 10. The target second connection repair line is positioned on the right side of the display panel, then the third connection repair point on the second connection repair line positioned corresponding to the target gate line is positioned on the right side of the display panel, such as point 6 shown in FIG. 10. The first connection repair point on the target gate repair line positioned corresponding to the target gate connection line is point 7 in FIG. 10. As shown in FIG. 11, using laser welding process to weld point 5, point 6, and point 7 (point 7 is not shown in FIG. 11). Wherein, welding point 7 to make the target gate connection line electrically connected to the target gate repair line, and welding point 5 and point 6 to make the target first connection repair line and the target second connection repair line connected to the target gate repair line electrically connected to the target gate line.

It should be noted that the display panel shown in FIG. 10 is dual-driving, welding points 5, 6, and 7 are configured to repair the target gate line and the target gate connection line, so that the target gate connection line is electrically connected to the target gate line through the target gate repair line, the target first connection repair line, and the target second connection repair line. The gate driving signals received by the target gate connection line are transmitted to the target gate line through the target gate repair line, the target first connection repair line, and the target second connection repair line.

It should be noted that the steps in step 201 to step 206 are same as those in step 101 to step 106, refer to the detailed description in step 101 to step 106, which will not be repeated here.

The method of manufacturing the above display panel can repair the connection failed target gate line and the corresponding target gate connection line, so that the connection failed target gate line continues to be in a valid state, and solves the problems of poor contact or connection failure between gate lines and gate connection lines in the display panel, and improves a product yield of the display panel.

In the above-mentioned embodiments, the description of each embodiment has its own focus. For parts that are not described in detail in an embodiment, reference may be made to related descriptions of other embodiments.

The display panel and the method of manufacturing the display panel provided in the embodiments of the present application have been described in detail above. Specific embodiments have been used in this document to explain the principle and implementation of the present application. The descriptions of the above embodiments are only used to help understand the technical solution of the present application and its core ideas. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising a display region and a non-display region positioned at a side of the display region, wherein the display region comprises:
    a plurality of gate lines extending laterally;
    at least one gate repair line;
    a plurality of gate connection lines extending longitudinally to the non-display region; and
    at least one first connection repair line extending longitudinally;
    wherein the at least one gate repair line is connected to the at least one first connection repair line in a one-to-one correspondence, each of the at least one gate repair line is provided with a plurality of first connection repair points positioned in one-to-one correspondence with the gate connection lines, and each of the first connection repair lines is provided with a plurality of second connection repair points positioned in one-to-one correspondence with the gate lines.

2. The display panel of claim 1, wherein the gate lines and the at least one gate repair line are arranged in a same layer, and the gate connection lines and the at least one first repair line are arranged in a same layer.

3. The display panel of claim 1, wherein orthographic projections of the gate connection lines on a level of the at least one gate repair line are intersected with each of the at least one gate repair line, and intersection positions are defined as the first connection repair points.

4. The display panel of claim 1, wherein orthographic projections of the at least one first connection repair line on a level of the gate lines are intersected with each of the gate lines, and intersection positions are defined as the second connection repair points.

5. The display panel of claim 1, wherein the at least one gate repair line is disposed at a side of the gate lines close to the non-display region.

6. The display panel of claim 1, wherein the at least one first connection repair line is disposed at at least one side of the gate connection lines.

7. The display panel of claim 1, wherein the display region further comprises at least one second connection repair line extending longitudinally, the at least one first connection repair line and the at least one second connection repair line are arranged at opposite sides of the gate connection lines, respectively, the at least one gate repair line is connected to the at least one second connection repair line in one-to-one correspondence, and each of the at least one second connection repair line is provided with a plurality of third connection repair points positioned in one-to-one correspondence with the gate lines.

8. The display panel of claim 7, wherein orthographic projections of the at least one second connection repair line on a level of the gate lines are intersected with the gate lines, and intersection positions are defined as the third connection repair points.

9. The display panel of claim 7, wherein the at least one gate repair line and the at least one first connection repair line are connected to each other in a one-to-one correspondence through a plurality of first vias, and the at least one gate repair line and the at least one second connection repair line are connected to each other in a one-to-one correspondence through a plurality of second vias.

10. A method of manufacturing a display panel, wherein the display panel comprises a display region and a non-display region positioned at a side of the display region, and the method of manufacturing the display panel comprises following steps:
    forming a plurality of gate lines extending laterally, at least one gate repair line, a plurality of gate connection lines extending longitudinally to the non-display region, and at least one first connection repair line extending longitudinally on the display region, wherein the at least one gate repair line is connected to the at least one first connection repair line in a one-to-one correspondence, each of the at least one gate repair line is provided with a plurality of first connection repair points positioned in one-to-one correspondence with the gate connection lines, and each of the first connection repair lines is provided with a plurality of second connection repair points positioned in one-to-one correspondence with the gate lines; and during a lighting test, wherein if a connection failure between a target gate line of the gate lines and a corresponding target gate connection line is detected, a target gate repair line is determined from the at least one gate repair line, one of the first connection repair lines connected to the target gate repair line is determined to be a target first connection repair line, and the first connection repair points on the target gate repair line positioned corresponding to the target gate connection line and the second connection repair points on the first connection repair line positioned corresponding to the target gate line are welded, to make the target gate connection line electrically connected to the target gate line through the target gate repair line and the target first connection repair line.

11. The method of manufacturing the display panel of claim 10, further comprising:

forming at least one second connection repair line extending longitudinally on the display region, wherein the at least one first connection repair line and the at least one second connection repair line are arranged at opposite sides of the gate connection lines, respectively, the at least one gate repair line is connected to the at least one second connection repair line in one-to-one correspondence, and each of the at least one second connection repair line is provided with a plurality of third connection repair points positioned in one-to-one correspondence with the gate lines;

wherein after the connection failure between the target gate line of the gate lines and the corresponding target gate connection line is detected, the method further comprises determining one of the second connection repair lines connected to the target gate repair line to be a target second connection repair line, and the third connection repair points on the target second connection repair line positioned corresponding to the target gate line are welded, to make the target gate connection line electrically connected to the target gate line through the target gate repair line, the target first connection repair line, and the target second connection repair line.

12. The method of manufacturing the display panel of claim 10, wherein the gate lines and the at least one gate repair line are arranged in a same layer, and the gate connection lines and the at least one first connection repair line are arranged in a same layer.

13. A display panel, comprising a display region and a non-display region positioned at a side of the display region, wherein the display region comprises:

a plurality of gate lines extending laterally;

at least one gate repair line;

a plurality of gate connection lines extending longitudinally to the non-display region; and at least one first connection repair line extending longitudinally;

wherein the at least one gate repair line is connected to the at least one first connection repair line in a one-to-one correspondence, each of the at least one gate repair line is provided with a plurality of first connection repair points positioned in one-to-one correspondence with the gate connection lines, and each of the first connection repair lines is provided with a plurality of second connection repair points positioned in one-to-one correspondence with the gate lines; and wherein the at least one gate repair line and the at least one first connection repair line are connected to each other in a one-to-one correspondence through a plurality of first vias.

14. The display panel of claim 13, wherein the gate lines and the at least one gate repair line are arranged in a same layer, and the gate connection lines and the at least one first connection repair line are arranged in a same layer.

15. The display panel of claim 13, wherein orthographic projections of the gate connection lines on a level of the at least one gate repair line are intersected with each of the at least one gate repair line, and intersection positions are defined as the first connection repair points.

16. The display panel of claim 13, wherein orthographic projections of the at least one first connection repair line on a level of the gate lines are intersected with each of the gate lines, and intersection positions are defined as the second connection repair points.

17. The display panel of claim 13, wherein the at least one gate repair line is disposed at a side of the gate lines close to the non-display region.

18. The display panel of claim 13, wherein the at least one first connection repair line is disposed at at least one side of the gate connection lines.

19. The display panel of claim 13, wherein the display region further comprises at least one second connection repair line extending longitudinally, the at least one first connection repair line and the at least one second connection repair line are arranged at opposite sides of the gate connection lines, respectively, the at least one gate repair line is connected to the at least one second connection repair line in one-to-one correspondence, and each of the at least one second connection repair line is provided with a plurality of third connection repair points positioned in one-to-one correspondence with the gate lines.

20. The display panel of claim 19, wherein orthographic projections of the at least one second connection repair line on a level of the gate lines are intersected with the gate lines, and intersection positions are defined as the third connection repair points.

* * * * *